US009278372B2

(12) United States Patent
Whitener

(10) Patent No.: US 9,278,372 B2
(45) Date of Patent: Mar. 8, 2016

(54) SECONDARY CONTAINMENT PANELS AND PROCESS FOR MAKING AND INSTALLING SAME

(75) Inventor: Michael Whitener, Ft Myers, FL (US)

(73) Assignee: Tight Line LLC, Fort Myers, FL (US)

(*) Notice: Subject to any disclaimer, the term of this patent is extended or adjusted under 35 U.S.C. 154(b) by 112 days.

(21) Appl. No.: 13/435,093

(22) Filed: Mar. 30, 2012

(65) Prior Publication Data

US 2012/0189810 A1 Jul. 26, 2012

Related U.S. Application Data

(63) Continuation-in-part of application No. 12/315,584, filed on Dec. 4, 2008.

(51) Int. Cl.
B05C 11/02 (2006.01)
B05D 3/12 (2006.01)
B32B 33/00 (2006.01)
C23C 14/54 (2006.01)
C23C 16/52 (2006.01)
B65D 90/24 (2006.01)

(52) U.S. Cl.
CPC . *B05C 11/02* (2013.01); *B05D 3/12* (2013.01); *B32B 33/00* (2013.01); *C23C 14/54* (2013.01); *C23C 16/52* (2013.01); *B65D 90/24* (2013.01); *Y10T 428/24355* (2015.01)

(58) Field of Classification Search
USPC ................. 427/141, 387, 421.1, 8; 118/665; 324/230, 228
See application file for complete search history.

(56) References Cited

U.S. PATENT DOCUMENTS

| 1,950,838 | A | * | 3/1934 | Burdick | 118/315 |
|---|---|---|---|---|---|
| 4,478,895 | A | | 10/1984 | Makami et al. | |
| 4,530,868 | A | | 7/1985 | Shinmi et al. | |
| 4,865,899 | A | | 9/1989 | Reichert | |
| 5,296,270 | A | | 3/1994 | Prosser | |
| 5,648,031 | A | * | 7/1997 | Sturtevant et al. | 264/80 |
| 6,395,845 | B1 | | 5/2002 | Weinmann et al. | |
| 6,998,147 | B2 | * | 2/2006 | Nesbitt | 427/8 |
| 2001/0046588 | A1 | * | 11/2001 | Sturtevant et al. | 428/141 |
| 2006/0280563 | A1 | * | 12/2006 | Glick | 405/302.7 |
| 2008/0003060 | A1 | | 1/2008 | Perkins | |

OTHER PUBLICATIONS

ASTM-D7091-05, "Standard Practice for Nondestructive Measurement of Dry Film Thickness of Nonmagnetic Coatings Applied to Ferrous Metals and Nonmagnetic, Nonconductive Coatings Applied to Non-Ferrous Metals", 2005, p. 1-7.*

* cited by examiner

Primary Examiner — Nathan T Leong
(74) Attorney, Agent, or Firm — David McEwing

(57) ABSTRACT

A method of manufacturing a plurality of secondary containment panels and assembling and installing the panels in a secondary containment system of an above-ground liquid storage tank or other retention facility includes forming a plurality of flexible substrate pieces. A liquid impermeable coating is applied to the upper surface of each piece such that an edge segment of the piece remains uncoated. The coating is applied to the substrate piece in an indoor enclosure using a computer controlled robotic sprayer that applies a uniform coating. Metal plates are embedded in the floor used for quality control testing of the coating thickness using magnetic gauges. At least a pair of the pieces are juxtaposed relative to one another such that a first one of the pieces overlaps the uncoated segment of the second piece to form a seam.

13 Claims, 6 Drawing Sheets

SECONDARY CONTAINMENT PANELS AND PROCESS FOR MAKING AND INSTALLING SAME

REFERENCE TO RELATED APPLICATION

This disclosure is a Continuation in Part application of application Ser. No. 12/315,584 filed Dec. 4, 2008, entitled Secondary Containment Panels and Process for Making and Installing Same.

FIELD OF THE INVENTION

This invention relates to a process for manufacturing secondary containment panels of the type used in connection with above-ground fuel and chemical storage tanks, as well as retention ponds and similar facilities. The panels are first manufactured offsite using a computer controlled robotic sprayer combined with non destructive measurement of dry film thickness and measurement of dry coating thickness with magnetic gauges within an environmentally controlled facility and then assembled and installed onsite to provide secondary containment in the event of spills or leaks.

BACKGROUND OF THE INVENTION

Above-ground petroleum storage tanks, chemical storage tanks and similar facilities typically utilize a secondary containment system for capturing hazardous liquid that leaks or spills from the tank. Secondary containment is also used for retention ponds, lakes and similar facilities to prevent polluting substances such as drill water, acids, gasses and unsafe chemicals from entering the water table. Conventional secondary containment systems employ an impermeable or impervious liner that extends across a basin or retention area. The liner, which is designed to prevent petroleum, chemicals or other hazardous materials from seeping into the ground, typically comprises a plurality of juxtaposed geotextile fabric panels. These panels are cut as required, arranged across the containment area and then sprayed with a polyurea coating that renders the panels impermeable to the passage of liquids discharged from the tank or otherwise held in the retention facility.

Assembling and installing secondary containment panels onsite presents a number of problems. Most significantly, when the polyurea is sprayed onto the geotextile fabric in the field, a significant amount of the impermeable coating is apt to be dissipated, lost and wasted due to wind and/or rain. Outdoor weather conditions tend to complicate the application process considerably. In order to provide the completed panels with a stippled, slip-resistant surface, the polyurea coating must be sprayed onto the geotextile fabric from a distance of about several feet or more. This separation causes at least some of the sprayed coating to dissipate and miss the fabric entirely, particularly under windy conditions. Indeed, in a typical secondary containment system, as much as 25% of the coating material can be wasted when it is applied outdoors and onsite. The evenness or uniformity of coating coverage on the surface of the fabric also varies tremendously.

An additional disadvantage accompanying conventional coating application procedures is that large amounts of polyurea coating and affiliated applicator equipment must be transported to and from the secondary containment site. The coating itself is typically transported to the site in 55 gallon drums. After the drums are emptied and the coating applied to the geotextile fabric, the drums must be removed for disposal. In addition, bulky applicator equipment including pumps, hoses, etc. must be transported to and from the secondary containment site. All of this adds to the complexity and expense of installing the secondary containment system.

SUMMARY OF THE INVENTION

It is therefore an object of the present invention to provide an improved and more efficient technique for manufacturing and installing secondary containment panels.

It is a further object of this invention to provide a method for assembling and installing the liner of a secondary containment system, which significantly reduces the amount of polyurea coating material that is lost and wasted during the installation.

It is a further object of this invention to provide a method for manufacturing secondary containment panels in an environmentally controlled indoor environment so that effective impervious panels are pre-made without being subjected to wind, rain and other adverse weather conditions that tend to dissipate and waste coating material when the secondary containment liner is manufactured outdoors and onsite.

It is a further object of this invention to provide a method for manufacturing, assembling and installing secondary containment panels that is far more efficient and cost effective than previous secondary containment installation techniques.

It is a further object of this invention to provide a method for manufacturing and installing secondary containment panels that significantly reduces the inconvenience and expense normally involved in transporting impermeable coating material to the secondary containment site and disposing of the empty containers for the coating after the coating has been applied.

It is a further object of this invention to provide a technique for assembling and installing secondary containment panels that reduces the need for much of the equipment, including pumps and hoses, normally required when the liner of a secondary containment system is manufactured in the field and onsite and which also significantly reduces the maintenance required for such equipment and costs associated therewith.

It is a further object of this invention to provide a method for manufacturing secondary containment panels that is simpler, more efficient and less costly than previously known techniques.

It is a further object of this invention to provide a method for manufacturing the liner of a secondary containment system which reduces the inefficiency and expense of transporting adhesive coating and associated application equipment (e.g. hoses and pumps) to the storage tank site where the secondary containment system is being installed and which thereby significantly facilitates installation of the secondary containment system and, in particular, the liner of the system.

It is a further object of this invention to provide a method for manufacturing secondary containment panels that are easy to roll-up and transport to a secondary containment site for onsite installation.

It is a further object of this invention to provide a method for manufacturing environmentally friendly secondary containment panels that can be repeatedly, conveniently and efficiently recycled and reused as needed.

This invention results from a realization that the impervious liner of a secondary containment system may be installed much more efficiently and cost effectively, and with far less waste of impermeable coating (e.g. polyurea) by prefabricating the liner in discrete secondary containment panels. These panels are pre-made in an environmentally controlled, enclosed facility wherein the impermeable coating is applied to an underlying substrate (e.g. geotextile fabric) without being subjected to potentially adverse outdoor conditions such as wind and rain. This significantly reduces the amount of coating that is wasted as the coating is sprayed or otherwise applied onto the fabric substrate. By the same token, the technique of this invention greatly lessens the complexity, expense and hassle normally involved with transporting drums of polyurea coating and associated applicator equipment (pumps, hoses, etc.) to and from the site of the secondary containment system.

This invention further results in improved quality control of the sprayed textile. This is achieved using a computer controlled robotic sprayer with improved spray rates (gallons per minute or "gpm") traversing a fabric width on a controlled companion sprayer carriage. The programmable computer controller ensures that the preselected spray pattern is uniformly applied. The spray rate of specified gallons per minute and distance travelled per minute can ensure that the fabric is coated with the selected thickness, permeation and surface stipling. It will be appreciated that the obtaining a uniform thickness of coating on the fabric is difficult when conducted by an individual. This difficulty is not removed by moving the spraying activity into an enclosed space. This problem is solved using a robotic sprayer.

The robotic sprayer may be equipped with a modified spray nozzle that increase output capacity and control overspray. The nozzle may be modified by removing an interior nozzle wall. This may prevent overspray. It can also increase the spray output to approximately 3 gpm.

The invention also results in improved quality control by facilitating use of industry accepted non destructive testing procedures requiring ferro-magnetic plates to be positioned beneath the fabric and post coating thickness testing performed in accordance with ASTM-D7091-05 Standard Practice for Nondestructive Measurement of Dry Film Thickness of Nonmagnetic Coatings Applied to Ferrous Metals and Nonmagnetic, Nonconductive Coatings Applied to Non-Ferrous Metals using either a Type I or Type II test gauge. Thickness testing may also be conducted per the frequency requirements of SSPC-PA2 (Paint Application Specification No. 2): Measurement of Dry Coating Thickness with Magnetic Gauges. The contents of ASTM-D7091-5 and SSPC-PA2 are hereby incorporated herein by reference in the entirety.

This invention features a method of manufacturing a secondary containment panel for use in a secondary containment system of an above-ground liquid storage tank or other liquid retention facility. A flexible, generally flat substrate piece is formed. A liquid impermeable coating is applied to an upper surface of the substrate piece while leaving an edge segment of the upper surface of the piece uncoated. The coating is applied to the piece inside an environmentally controlled enclosure.

In a preferred embodiment, the coating is sprayed onto the substrate piece. The substrate piece may include a geotextile fabric and the coating may be polyurea. Typically, the coating is sprayed on the substrate piece from a distance sufficient to form a slip-resistant stippled surface on the upper surface of the piece.

This invention also features a method for manufacturing, assembling and installing a plurality of secondary containment panels for use in a secondary containment system. Each panel is manufactured in the previously described manner by coating respective substrate pieces in an environmentally controlled enclosure and providing each piece with an uncoated edge segment. After the coated substrate pieces defining the panels are manufactured, those pieces delivered to the site of a storage tank or retention facility (e.g. lake or pond). The coated substrate pieces are then extended across the ground adjacent to the tank and at least a pair of pieces are juxtaposed relative to one another such that a bottom surface of a first one of the pieces overlaps the uncoated edge segment of a second substrate piece to form a seam between the pieces. An adhesive substance is applied to the seam to secure the pieces together. In particular, polyurea coating, two sided adhesive tape or other adhesives are introduced between the lower surface of the first substrate piece and the uncoated edge segment of the second piece to fasten together the first and second pieces. Adhesive may also be applied across the seams and to the upper surface of the overlapping substrate pieces.

DETAILED DESCRIPTION OF PREFERRED EMBODIMENTS

Other objects, features and advantages will occur from the following description of a preferred embodiment and the accompanying drawings, in which.

Figure 1:
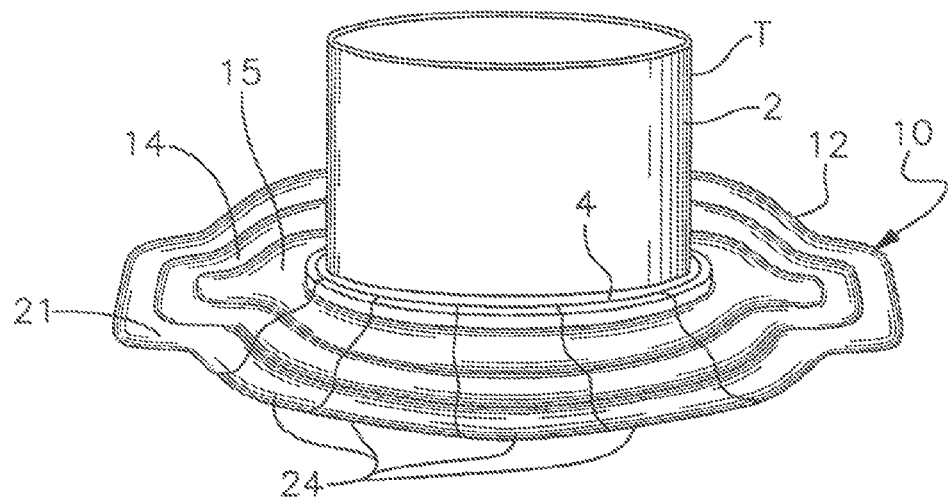
FIG. 1 is a perspective view of an above-ground liquid storage tank utilizing a secondary containment system featuring a liner comprising secondary containment panels manufactured in accordance with this invention.

There is shown in FIG. 1 an above-ground storage tank T for accommodating an environmentally sensitive and potentially hazardous liquid such as petroleum or various other types of chemicals. Although the typical tank has a generally cylindrical configuration, the particular size, shape, construction and type of tank are not limitations of this invention. In the version illustrated herein, tank T includes a generally cylindrical tank shell 2 that is supported upon a concrete ring wall or slab 4. It should be understood that various alternative tank constructions may be utilized within the scope of this invention. It should also be understood that various types of liquids may be accommodated within tank T. Most commonly, such tanks are utilized to hold petroleum and assorted types of hydrocarbon fuels. Potentially hazardous chemicals are also stored in above-ground tanks of this type.

A secondary containment system 10 commonly is installed about tank T in order to catch and retain liquid fuel or chemicals that have spilled from tank T due, for example, to a leak in the shell of the tank or in the pipes or other equipment associated with the tank. Spills can also be caused by overfilling the tank. System 10 comprises a secondary containment liner 12 that extends across the ground surrounding tank T. The secondary containment system may also feature various other components including sensors, alarms, switches and valves (not shown), which react to a liquid spill by shutting off further pumping of liquid into the tank T and which notify the owner/operator of the spill so that needed repairs and other corrective action may be performed.

Figure 2:
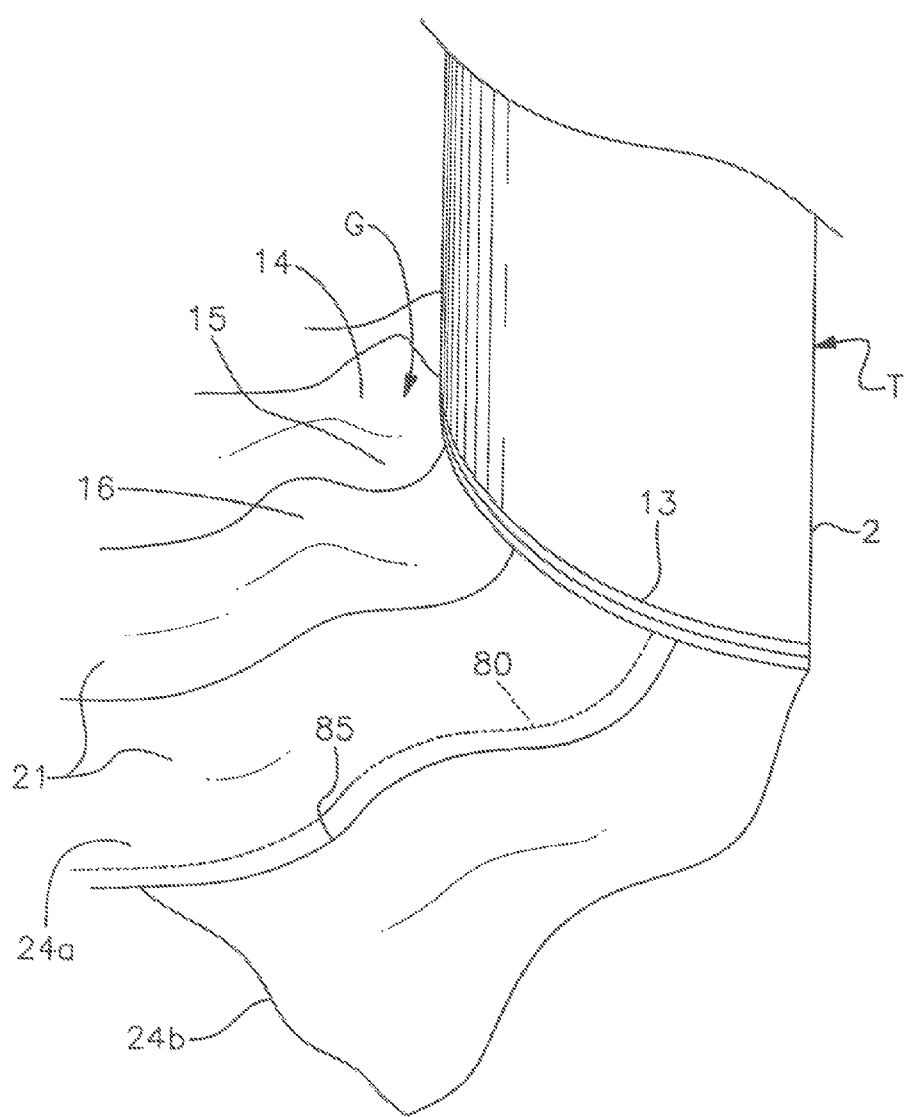
FIG. 2 is a fragmentary perspective view of a section of a liquid storage tank having a liquid retention berm formed about the tank; a pair of secondary containment panels are juxtaposed about the tank and extend across the berm in accordance with this invention.

System 10 specifically includes an earthen berm 14 that encircles or otherwise surrounds tank T. As further shown in FIG. 2, berm 14 comprises a liquid containment wall disposed upon and rising above the underlying ground surface G. The berm defines a spill retention basin 15 between tank T and berm 14. Berm 14 may comprise earthen material such as native or outsourced soils. Alternatively, the berm may include reinforced concrete, steel sheets driven into underlying ground surface G, concrete blocks and/or asphalt. Berm 14 is typically configured in a generally annular fashion about the tank as best shown in FIG. 1. It is built at various select distances from the tank shell in order to provide the needed containment capacity. Preferably, the berm is about 5'-20' from the outer wall of the tank shell, although this distance may be varied. Berm 14 is constructed to have a height of approximately 12"-24", although such height may again be varied to provide the needed secondary containment capacity about the tank. As best shown in FIG. 2, berm 14 has a sloped inner wall 16 generally facing tank T. Berm 14 may include various other non-annular configurations suited to conform to the area about the tank available for secondary containment. It is only necessary that the berm peripherally surround the tank so that spilled fuel is retained within the basin defined by the berm. The precise shape of the berm may be varied within the scope of this invention.

A trench 21, FIGS. 1 and 2, is disposed annularly about tank T radially outwardly of berm 14 and immediately adjacent to the berm. This trench, which is optional, helps to securely retain impermeable liner 12 within the spill retention basin. Liner 12 extends across basin 15 and, in particular, covers berm 14 and the intermediate ground surface G formed between tank T and berm 14. Liner 12 typically comprises a flexible geotextile fabric sheet that is constructed of an industrial fabric composed of woven fibers. Alternative materials may be substituted within the scope of the invention. The sheet forms a substrate to which a liquid polyurea coating layer impermeable to liquids is spray coated or otherwise applied. Alternative types of impermeable coatings materials may also be used. In the event of an accidental leak, overfill or spill of fluid, impermeable liner 12 captures the leaked fluid and retains it within the basin 15 so that the environmentally hazardous liquid does not seep into the ground and underlying water table.

The foregoing secondary containment construction is largely conventional. Typically, the liner is constructed and installed by configuring sheets of the geotextile fabric about the storage tank so that the sheets extend across the ground and cover the area defining the spill retention basin, as well as the berm and trench. The impermeable coating is then sprayed onto the fabric and allowed to cure. As previously described, this procedure has presented several problems. Governmental regulations have commonly required that the upper surface of the liner be stippled to provide a non-skid/slip surface. To accomplish this, the polyurea coating material must be sprayed onto the upper surface of the geotextile fabric in a pattern achieved only by holding the nozzle of the sprayer a distance of about several feet from the fabric. As a result, when the coating is sprayed in the field and onsite, it tends to dissipate in the outdoor environment. A considerable amount of coating material (e.g. up to 25%) can be lost and wasted, especially when windy, rainy or other adverse weather conditions are encountered. In addition, significant quantities of coating material, which is typically stored in 55 gallon drums, must be transported to the site of the storage tank. After the coating is applied, the empty drums must be removed and discarded. Applicator equipment including pumps and hoses must also be transported to and from the site. All of this adds significantly to the inconvenience and cost of installing the secondary containment system.

The present invention overcomes the foregoing problems. As shown in FIG. 1, liner 12 includes a plurality of secondary containment panels 24 that are individually manufactured, in accordance with this invention, before they are delivered to the site and assembled. A representative pair of adjoining panels 24a and 24b are depicted in FIG. 2 and described more fully below.

Figure 3:
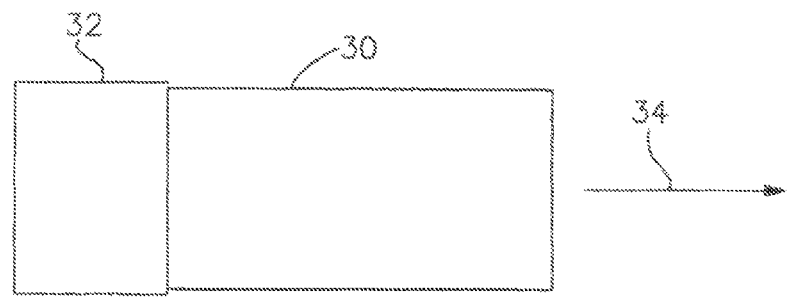
FIG. 3 is a diagrammatic view of a roll of geotextile fabric being deployed in order to manufacture the secondary containment panels in accordance with this invention.
Figure 4:
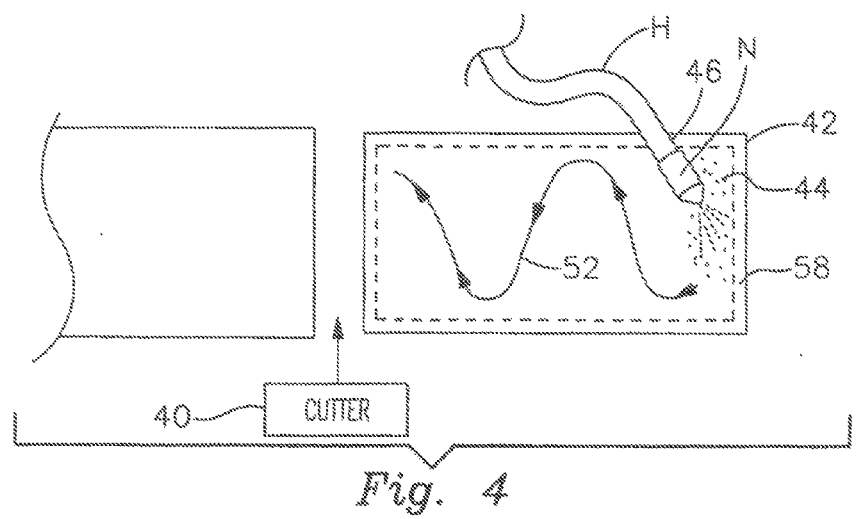
FIG. 4 is a diagrammatic view of a piece of geotextile fabric being cut and having a liquid impermeable coating applied thereto.

A critical aspect of this invention is that the secondary containment panels are manufactured individually in an environmentally controlled indoor environment prior to delivery to the site of the storage tank. As shown in FIG. 3, a selected length of flexible geotextile fabric substrate 30 is unwound in the direction of arrow 34 from a supply roll 32 of such material. Typically, such fabric is available in rectangular dimensions. The width of the substrate and the selected length deployed from roll 32 may be varied widely within the scope of the invention. For example, the width of the substrate may be approximately 12'. Various alternative lengths (e.g. 30', 60', 80') may be selected to be compatible with the size of the secondary containment system that is being constructed for a particular tank. Various alternative widths may also be employed. As shown in FIG. 4, when a desired length of fabric has been deployed, the fabric is transversely cut by a standard cutting machine or tool 40 to produce a rectangular substrate piece 42. Additional substrate pieces are formed in an analogous fashion.

Figure 5:
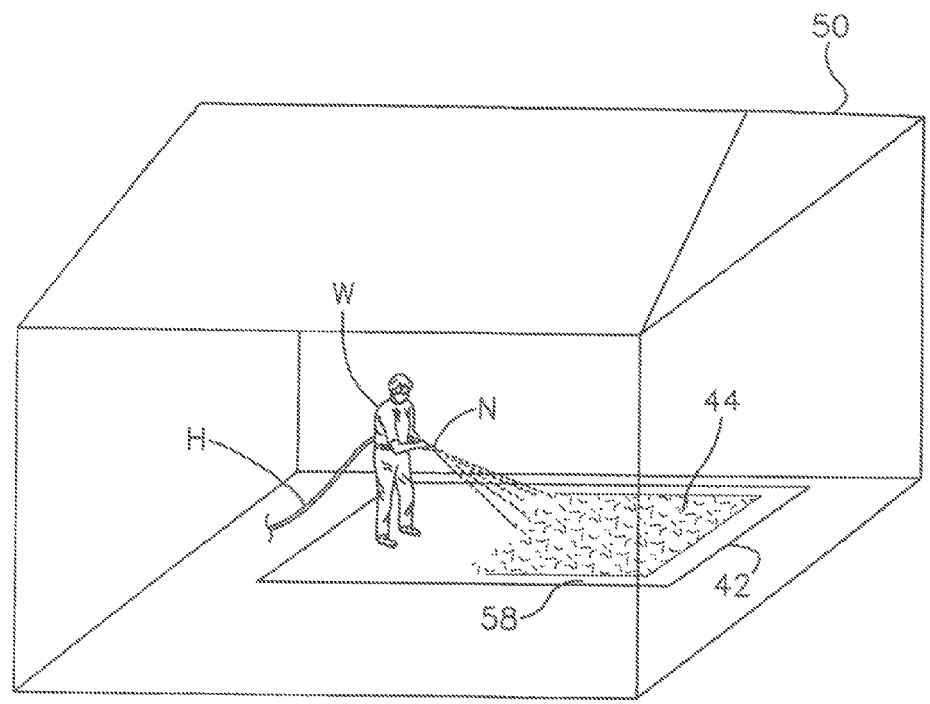
FIG. 5 is a simplified perspective view depicting the process of an impermeable coating such as polyurea being applied to an upper surface of a piece of geotextile fabric in an environmentally controlled indoor enclosure.
Figure 9:
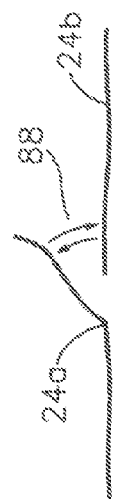
FIG. 9 is an elevational view of the juxtaposed panels prior to interengagement of the panels.

After piece 42 has been produced, polyurea coating 44 is sprayed onto the upper surface of piece 42 by a conventional sprayer 46. As shown in FIG. 5, it is important that this spray application be performed in an environmentally controlled indoor enclosure 50, which may comprise a factory, warehouse or other manufacturing facility. As shown therein, worker W holds an applicator hose H and directs an applicator nozzle N at the upper surface of substrate piece 42. Hose H is operably connected to a conventional applicator pump and supply of polyurea or other coating (not shown). The worker operates the applicator equipment to spray polyurea 44 onto the upper surface of substrate piece 42 in the manner shown in FIGS. 4 and 5. In particular, the worker proceeds generally from the leading end of piece 42 to the trailing end and sprays the polyurea onto the geotextile fabric in a reciprocating pattern 52, FIG. 4. The layer of polyurea 44 is normally applied at approximately 80 mils dry-film thickness. Other thicknesses may be used within the scope of this invention. Worker W holds the tip of nozzle N a sufficient desired distance (e.g. 3') from the upper surface of piece 42 so that a non-slip stippled finish or pattern is formed by coating 44 on substrate piece 42. While applying the coating, worker W should be careful to leave an uncoated edge segment 58 about some or all of the periphery of piece 42. This uncoated edge segment may be left about the entire perimeter of piece 42 or only along one side or other edge segment of the substrate piece. The uncoated edge segment facilitates adhesion of the substrate to an overlapping adjoining piece when the substrate pieces are assembled and installed at the storage tank site.

Figure 6:
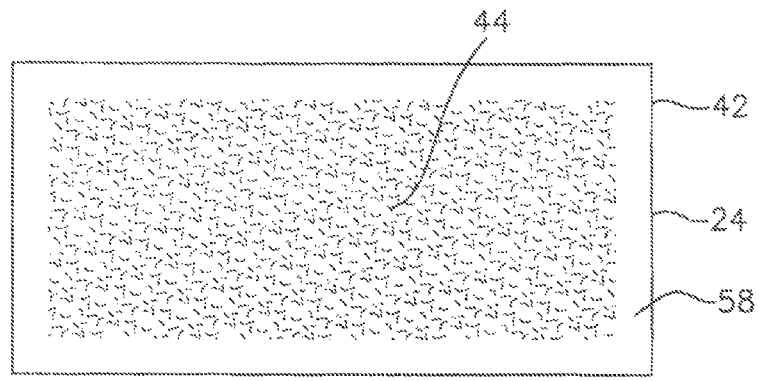
FIG. 6 is a plan view of a secondary containment panel manufactured in accordance with the method of this invention.

When worker W reaches a selected short distance from the trailing edge of substrate piece 42, application of coating 44 is completed. The coating is then allowed to cure so that a completed secondary containment panel 24, shown in FIG. 6, is formed. That panel comprises the underlying flexible substrate piece 42 and the applied impermeable coating material 44, which defines a stippled texture. Uncoated edge region 58 surrounds coated upper surface 44. As previously indicated, the uncoated edge segment extends at least partially about the periphery of panel 24. The completed panel maintains its flexibility and is easy to roll-up so that it can be compactly and conveniently transported to a desired installation site.

In alternative embodiments, the coating material may be sprayed onto or otherwise applied to the substrate pieces by various other means including robotic applicators and alternative machines. The manner in which the coating is applied is not a limitation of this invention.

With regard to the embodiment utilizing a robotic applicator, in one embodiment a self propelled steerable and computer controlled robot is employed. In one embodiment, a traversing robot from SprayWorks Equipment Group, Inc. may be used. The robot may comprise a spray nozzle and component mixing unit that traverses above the fabric and crosses on a self propelled computer controlled sprayer carriage. The nozzle may be directed vertically down to the fabric surface. In another embodiment, the nozzle may be directed horizontally to broadcast the coating material. The nozzle may also be directed at an angle to the surface, e.g., 45°. The nozzle can be elevated 3 to 4 feet from the fabric surface. Other distances are possible.

The extent of movement of the spray nozzle unit is controlled by the computer. After a section of fabric is traversed a predetermined number of times, the carriage can be propelled forward to a new section of fabric and the process repeated. It will be appreciated that the computer control of the robot movements allows for a uniform coating to be applied that is unachievable by hand spraying.

The robot may comprise a spray nozzle. It may also may contain an impingement block for mixing the two components of the polyurea (PUA) coating. The flow through the impingement block is controlled by a computer controlled termination rod. The robot controls the speed and disbursement rate of polyurea coating. The robot also controls the direction or position of the nozzle relative to the fabric. In one embodiment, a Graco Probler P2 (air purge) or Graco Gusmer GX-7spray gun may be a used. The spray portioning unit may be supplied from 21st JMT.

The modified nozzle can spray at an accelerated rate of 3 gpm. It will be appreciated that this is a disbursement rate greater than can be achieved by an individual. The robotically controlled nozzle applies polyurea on the fabric at a thickness from 40 to 120 mils (1.0 to 3.0 mm) with a preferred rate of 40 to 100 mils (1.0 to 2.5 mm) and a most preferred at 40 to 80 mils (1.0 to 2.0 mm). It will be appreciated that the thickness will be uniformly applied by the computer controlled robot.

In one embodiment, the fabric can be spun-bonded geotextile. The fabric may alternatively be a non-woven geotexitle. The fabric may have a weight range of 4 to 12 oz. In the preferred embodiment, the fabric is spun-bonded with a weight range of 4 to 8 oz. The most preferred embodiment the fabric is 4 oz weight spun bonded.

The spun-bonded fabric may be obtained under the tradename Typar supplied by Remay. The non-woven fabric may be obtained under the tradename Petromat supplied by Amoco Geotextiles.

The method may also comprise advanced quality control of the coating thickness, permeation and surface texture. Ferromagnetic plates may be placed on a firm level surface where fabric coating is to be conducted. The uncoated fabric is positioned on the floor. A single fabric layer may be coated. The fabric is position over a plurality of the ferro-magnetic plates. It may also be positioned so that the robotic sprayer carriage straddles the width of the fabric. The total length and width of the fabric piece is accessible to the spray nozzle of the robot. It will be appreciated that the robot sprayer carriage can hold the coating mixture supply hoses, for example the A and B components of a polyurea coating.

After the coating is applied to the fabric, magnetic gauges may be placed in contact with the upper surface of the coated fabric, i.e., Type II constant contact gauges, to determine the thickness of the coating. The number or shape of the plates is not limited.

Figure 11:
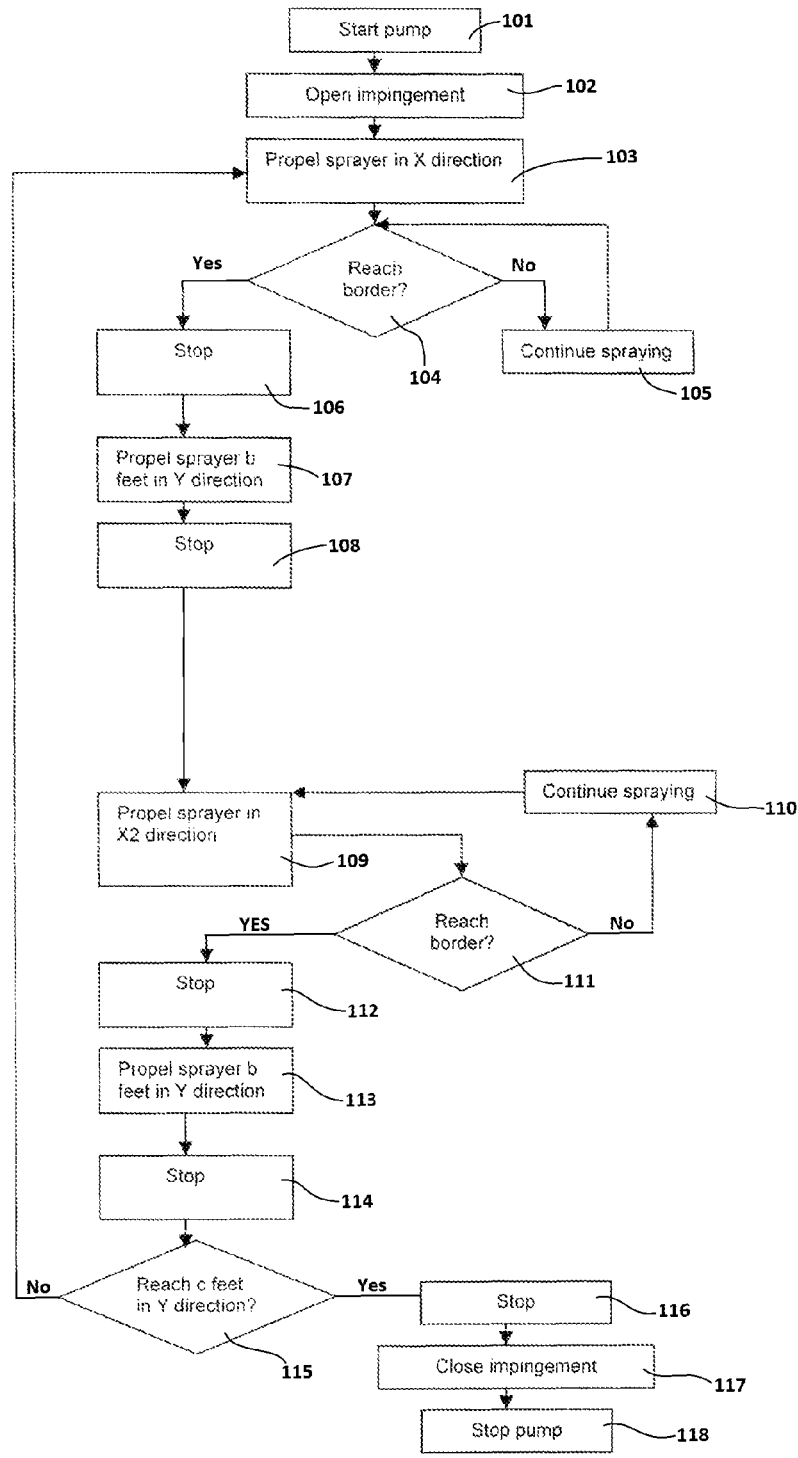
FIG. 11 is a logic flow diagram of the programmable program controlling the robotic sprayer.

FIG. 11 illustrates one embodiment for a computer controlled logic flow diagram for controlling the operation of the carriage mounted robot. It will be appreciated that the carriage mounted robotically controlled spray nozzle straddles the width of a single layer of positioned fabric. The spray nozzle may be positioned at one end of the carriage. The robot operation may commence with activation of pump 101 supplying the coating components to the sprayer. The termination rod may be retracted to open the impingement chamber 102. The robot propels the sprayer 103 at a predetermined rate across the robot sprayer carriage. The sprayer is traversing across the width of the fabric (X direction) while spraying the fabric with coating. The computer program computes the distance the sprayer has traversed and compares it to the inputted width of the fabric. The computer determines whether the sprayer has reached the fabric edge 104. It will be appreciated that the computer can be programmed to stop the sprayer at a certain distance from the fabric edge, i.e., an uncoated fabric boarder may be desired. If it is determined that the sprayer has not reached the boarder 105, the sprayer continues spraying.

If it is determined that the boarder (or other selected distance) has been reached, the traverse movement of the sprayer stops 106. The carriage is propelled 107 forward in the Y direction (moving a predetermined distance along the length of the fabric). When the predetermined distance is reached, the carriage stops 108. The sprayer now traverses back across the carriage (the X2 direction) 109. Again the computer tracks the distance that the sprayer traverses across the carriage 111. If the boarder is reached the movement of the spray is stopped 112. If the boarder has not been reached, the sprayer continues spraying 110.

If the sprayer is stopped due to reaching the boarder of the fabric (or other predetermined distance) the carriage is again propelled in the Y direction (moving a predetermined distance along the length of the fabric 113. When the carriage travels the specified distance, it stops 114. The computer determines whether the carriage has travelled the length of the fabric (travel is the Y direction) 115. If no, the sprayer again traverses the across the carriage in the X direction. If the computer program determines the predetermined Y direction (designated c on FIG. 11) has been traversed, the carriage stops 116, the impingement chamber is closed 117 and the pump is shut off 118.

Figure 7:
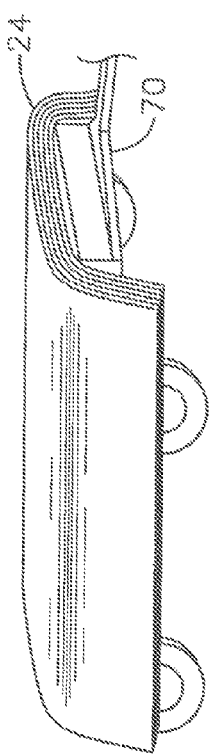
FIG. 7 is a perspective view of a supply of secondary containment panels supported upon a trailer for transport to a storage facility where the panels are installed as part of a secondary containment system for the facility.
Figure 8:
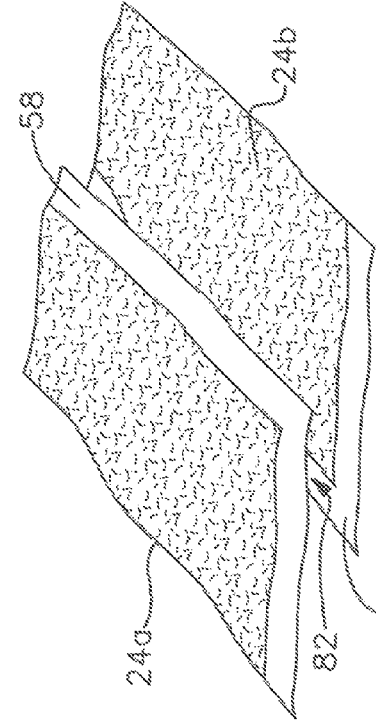
FIG. 8 is a simplified perspective view depicting how a pair of adjoining panels are juxtaposed and adjoined to form a liner of the secondary containment system.

After a desired number of panels 24 required for a particular job are manufactured in the foregoing manner, they are transported to the storage tank site or other liquid retention site by various means of transportation. For example, as shown in FIG. 7, a number of panels 24 are draped across or stacked upon a trailer 70 that is pulled by an appropriate delivery vehicle (not shown). The flexible panels may also be quickly and conveniently rolled-up and stacked in the delivery vehicle. When the panels arrive at the site, they are unloaded, unrolled if necessary, and arranged about the periphery of tank T as shown in FIGS. 1 and 2. Individual panels 24 may be cut as needed to accommodate and conform to the tank and equipment such as pipes and machinery associated with the tank. For example, as best shown in FIG. 2, individual panels such as representative panels 24a and 24b are oriented to extend longitudinally from tank ring wall 13 (which the panels overlap) across the ground G defining basin 15 and berm 14. The distal end of each panel 24a and 24b is disposed in trench 21. Various other configurations and orientations may be employed within the scope of this invention. The individual panels may be arranged and juxtaposed in any manner and orientation needed to provide substantially complete liner coverage over basin 15 and the ground area surrounding tank T. Substantially complete coverage is required so that the liner will adequate capture and retain any liquid that accidentally spills or leaks from the tank.

Figure 10:
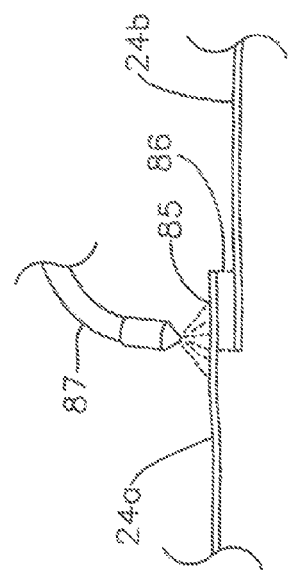
FIG. 10 is an elevational view of the panels after they have been adhesively fastened together.

After the panels 24 are arranged and stretched out across the ground surrounding the tank, adjoining panels are fastened together to from the liner of the secondary containment system in the manner shown in FIGS. 2 and 8-10. In particular, as represented by adjoining panels 24a and 24b, respective edge segments 58 of these panels are overlapped to form a seam 85. The longitudinal left-hand edge 80 of underlying panel 24b is disposed beneath panel 24a as shown in FIGS. 2 and 8-10. The adjoining panels are then adhesively joined by introducing an adhesive substance between the overlapping edge segments 58 as indicated by arrow 82 in FIG. 8. This adhesive substance may comprise a two sided tape 86, FIG. 10, or alternatively various types of glues, epoxies or other forms of adhesive. Polyurea coating or alternative types of coating materials may also be introduced between the overlapping panels. In either case, the overlapping edge segments of respective panels 24a and 24b are pressed together as indicated by opposing arrows 88 in FIG. 9. Finally, as depicted in FIG. 10, coating material is sprayed by sprayer 87 across the upper surface of seam 85 and typically onto the adjacent sections of panels 24a and 24b. This seals and securely fastens together the adjoining panels. A similar inter engagement and interconnection is made between each of the other panels 24 of the secondary containment liner 12.

In contrast, to prior liner installation techniques, application of polyurea coating onsite is generally limited to regions of the seams along the seams or joints formed between the adjoining panels. The liner thus requires the application of far less coating in the field than is conventionally required when the entire liner is spray coated with polyurea as is performed in the prior art. Because much less coating is applied onsite, there is far less waste of such material. In addition, less coating material, fewer storage tanks and less related applicator equipment need to be transported to and from the installation site.

In alternative embodiments, panels 24 may be assembled and installed in an analogous manner in applications such as retention ponds and lakes and "frac" containment facilities. The panels are constructed and installed in the manner previously described and achieve corresponding advantages to those described in the storage tank embodiment.

The panels are environmentally friendly and can be reused and recycled as needed. When use of the assembled panels is no longer required at a particular containment site, the liner can be cut along the seams or otherwise to form reusable panels. These used panels can then be conveniently rolled-up and transported to a new containment site where they can be re-seamed and/or reassembled with newly manufactured panels (made as previously described) and reinstalled as a new secondary containment liner. This technique saves materials and cost and improves efficiency considerably.

Accordingly, the system of the present invention allows for secondary containment liners to be assembled and installed much more efficiently than has been done previously. Because the coating is applied in an environmentally controlled indoor site with robotically controlled equipment for uniform application, far less material is wasted. Consumption of coating components is reduced by approximately 90% (plus/minus 3%). Production costs are thereby significantly reduced. By the same token, much less coating material and related application equipment is required at the site of the storage tank. Transportation costs and inconvenience are thereby significantly reduced. In addition, the cost and annoyance associated with delivering 55 gallon drums of coating to the job site and then disposing of those drums after installation of the secondary containment system is completed are reduced significantly.

From the foregoing it may be seen that the apparatus of this invention provides for a process for manufacturing secondary containment panels of the type used in connection with above-ground fuel and chemical storage tanks. While this detailed description has set forth particularly preferred embodiments of the apparatus of this invention, numerous modifications and variations of the structure of this invention, all within the scope of the invention, will readily occur to those skilled in the art. Accordingly, it is understood that this description is illustrative only of the principles of the invention and is not limitative thereof.

Although specific features of the invention are shown in some of the drawings and not others, this is for convenience only, as each feature may be combined with any and all of the other features in accordance with this invention.

This specification is to be construed as illustrative only and is for the purpose of teaching those skilled in the art the manner of carrying out the invention. It is to be understood that the forms of the invention herein shown and described are to be taken as the presently preferred embodiments. As already stated, various changes may be made in the shape, size and arrangement of components or adjustments made in the steps of the method without departing from the scope of this invention. For example, equivalent elements may be substituted for those illustrated and described herein and certain features of the invention maybe utilized independently of the use of other features, all as would be apparent to one skilled in the art after having the benefit of this description of the invention.

While specific embodiments have been illustrated and described, numerous modifications are possible without departing from the spirit of the invention, and the scope of protection is only limited by the scope of the accompanying claims.

Other embodiments will occur to those skilled in the art and are within the following claims:

What I claim is:

1. A method comprising:
   a) laying out and positioning a substrate having a length and a width wherein the substrate is in a flat stationary position on a flat stationary surface or floor;
   b) positioning a self propelled robotically longitudinally moveable computer controlled carriage and only one sprayer laterally movable across the carriage wherein the carriage is moveable upon the flat surface proximate to or straddling over the substrate;
   c) connecting the sprayer to a coating supply source;
   e) activating the computer controlled sprayer and carriage to move and spray;
   f) spraying an impenetrable coating in a lateral direction by traversing the sprayer across the carriage wherein the sprayer is in a fixed orientation relative to the underlying stationary substrate;
   g) continuing to spray an impenetrable coating by moving the carriage longitudinally over the stationary substrate, wherein the carriage may move on the flat surface to straddle over the entire length of substrate; and
   h) allowing the coated substrate to cure on the flat surface without stretching or distorting the substrate.

2. The method of claim 1 further comprising moving the self propelled carriage over the substrate.

3. The method of claim 1 further comprising spraying a coating through a nozzle at a rate of 3 gallons per minute.

4. The method of claim 1 wherein the coating includes polyurea coating.

5. The method of claim 4 in which said coating has a thickness of a range of 1 to 3 mm.

6. The method of claim 1 further comprising a plurality of ferromagnetic plates positioned on the flat surface and positioning the substrate over the ferromagnetic plates.

7. The method of claim 6 in which the thickness of the coating is measured by placing magnetic gauges proximate to ferromagnetic metal pieces beneath the coated substrate.

8. The method of claim 7 in which the ferro-magnetic metal pieces are attached to the floor.

9. A method of coating a fabric substrate comprising:
   a) positioning the fabric substrate flat upon a floor surface wherein a width of the self propelled robotically controlled carriage straddles laterally the width of the fabric substrate;
   b) activating the self propelled robotically controlled carriage and only one sprayer;
   c) activating the sprayer to traverse across the robotically controlled carriage while said carriage is stationary and the sprayer is spraying the fabric substrate beneath it;
   d) the sprayer spraying the substrate with an impermeable coating as the sprayer laterally traverses across the carriage, the sprayer coating at least a portion of the width of the substrate, and the sprayer remaining in a fixed orientation to a surface of the substrate;
   e) moving the carriage forward longitudinally a fixed distance over a portion of the fabric substrate; and
   f) repeating steps c through e until at least a portion of the substrate is coated.

10. The method of claim 9 further comprising orientating the sprayer in a fixed substantially vertical direction to the surface of the substrate.

11. The method of claim 9 further comprising orienting the sprayer in a fixed substantially horizontal direction to the surface of the substrate.

12. The method of claim 9 further comprising orientating the sprayer in a variable fixed orientation to the surface of the substrate.

13. A method of coating a substrate with a computer controlled robotic sprayer and self propelled sprayer carriage comprising:
   a) positioning a computer controlled self propelled robotic sprayer carriage in relation to a substrate having a length and width;
   b) positioning the substrate substantially flat on a stationary flat surface;
   c) positioning the width of the substrate in relation to a width of the self propelled sprayer carriage so that the width of the carriage spans the entire width of the substrate;
   d) spraying an impenetrable layer of coating on the substrate with the single sprayer while moving the single sprayer on the carriage across at least a portion of the width of the stationary substrate wherein the single sprayer remains in a fixed orientation; and
   e) moving the carriage in relation to the stationary substrate length.

* * * * *